(12) United States Patent
Amemiya et al.

(10) Patent No.: US 8,451,155 B2
(45) Date of Patent: May 28, 2013

(54) TRANSMISSION CIRCUIT, ULTRASONIC PROBE AND ULTRASONIC IMAGE DISPLAY APPARATUS

(75) Inventors: Shinichi Amemiya, Tokyo (JP); Bruno Haider, Ballston Lake, NY (US); Naresh Kesavan Rao, Clifton Park, NY (US); Krishnakumar Sundaresan, Clifton Park, NY (US); Thomas Halvorsrod, Horten (NO)

(73) Assignee: General Electric Company, Schenectady, NY (US)

( * ) Notice: Subject to any disclaimer, the term of this patent is extended or adjusted under 35 U.S.C. 154(b) by 152 days.

(21) Appl. No.: 13/035,675

(22) Filed: Feb. 25, 2011

(65) Prior Publication Data

US 2012/0218135 A1    Aug. 30, 2012
US 2013/0099950 A9    Apr. 25, 2013

(51) Int. Cl.
    *H03M 1/66*        (2006.01)
(52) U.S. Cl.
    CPC ........................................ *H03M 1/66* (2013.01)
    USPC ............ 341/135; 341/147; 327/108; 367/138
(58) Field of Classification Search
    USPC ... 341/135, 144, 147; 327/108, 111; 367/137, 367/138
    See application file for complete search history.

(56) References Cited

U.S. PATENT DOCUMENTS

| 5,861,830 | A  | * | 1/1999  | Cheng et al. ................... 341/135 |
| 6,868,729 | B2 |   | 3/2005  | Amemiya |
| 7,372,388 | B2 |   | 5/2008  | Amemiya |
| 7,391,393 | B2 | * | 6/2008  | Yang et al. ...................... 345/76 |
| 7,397,406 | B2 |   | 7/2008  | Amemiya |
| 7,443,327 | B2 | * | 10/2008 | Chida et al. .................... 341/144 |
| RE40,971  | E  | * | 11/2009 | Sutardja ......................... 341/144 |
| 7,777,394 | B2 |   | 8/2010  | Amemiya |
| 7,855,609 | B2 |   | 12/2010 | Amemiya |
| 2006/0264747 | A1 | * | 11/2006 | Freeman et al. ............... 600/437 |
| 2008/0264171 | A1 | * | 10/2008 | Wodnicki ......................... 73/618 |
| 2010/0019833 | A1 |   | 1/2010  | Zang et al. |
| 2010/0041997 | A1 |   | 2/2010  | Amemiya et al. |
| 2010/0331703 | A1 |   | 12/2010 | Amemiya |
| 2012/0092954 | A1 | * | 4/2012  | Suzuki et al. ...................... 367/7 |

FOREIGN PATENT DOCUMENTS

| JP | 2004-358133    | 12/2004 |
| JP | 2008-068014    | 3/2008 |
| WO | WO 2010101104 A1 * | 9/2010 |

* cited by examiner

*Primary Examiner* — Howard Williams
(74) *Attorney, Agent, or Firm* — Armstrong Teasdale LLP

(57) ABSTRACT

A transmission circuit for use with an ultrasonic probe including an ultrasonic transducer is provided. The transmission circuit includes a high voltage current DAC configured to output a drive current of an ultrasonic transducer to transmit and receive ultrasound, and a waveform generator configured to output a control signal from the high voltage current DAC to the high voltage current DAC with a predetermined timing. The control signal configured to output the drive current with a desired magnitude.

16 Claims, 10 Drawing Sheets

FIG. 6

| SW2α | SW2β | SW2γ | SW2δ | SW2ε | DRIVE CURRENT I |
|---|---|---|---|---|---|
| 0 | 0 | 0 | 0 | 0 | 0 |
| 0 | 0 | 0 | 0 | 1 | i |
| 0 | 0 | 0 | 1 | 0 | 2i |
| 0 | 0 | 0 | 1 | 1 | 3i |
| 0 | 0 | 1 | 0 | 0 | 4i |
| 0 | 0 | 1 | 0 | 1 | 5i |
| 0 | 0 | 1 | 1 | 0 | 6i |
| 0 | 0 | 1 | 1 | 1 | 7i |
| 0 | 1 | 0 | 0 | 0 | 8i |
| 0 | 1 | 0 | 0 | 1 | 9i |
| ⋮ | ⋮ | ⋮ | ⋮ | ⋮ | ⋮ |
| 1 | 1 | 1 | 0 | 0 | 28i |
| 1 | 1 | 1 | 0 | 1 | 29i |
| 1 | 1 | 1 | 1 | 0 | 30i |
| 1 | 1 | 1 | 1 | 1 | 31i |

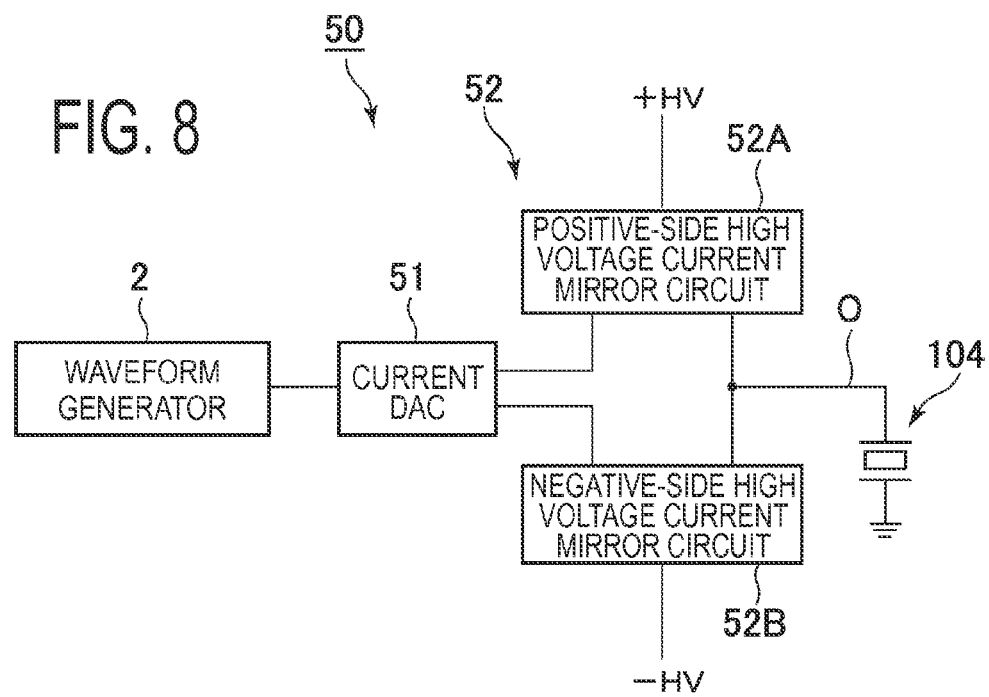
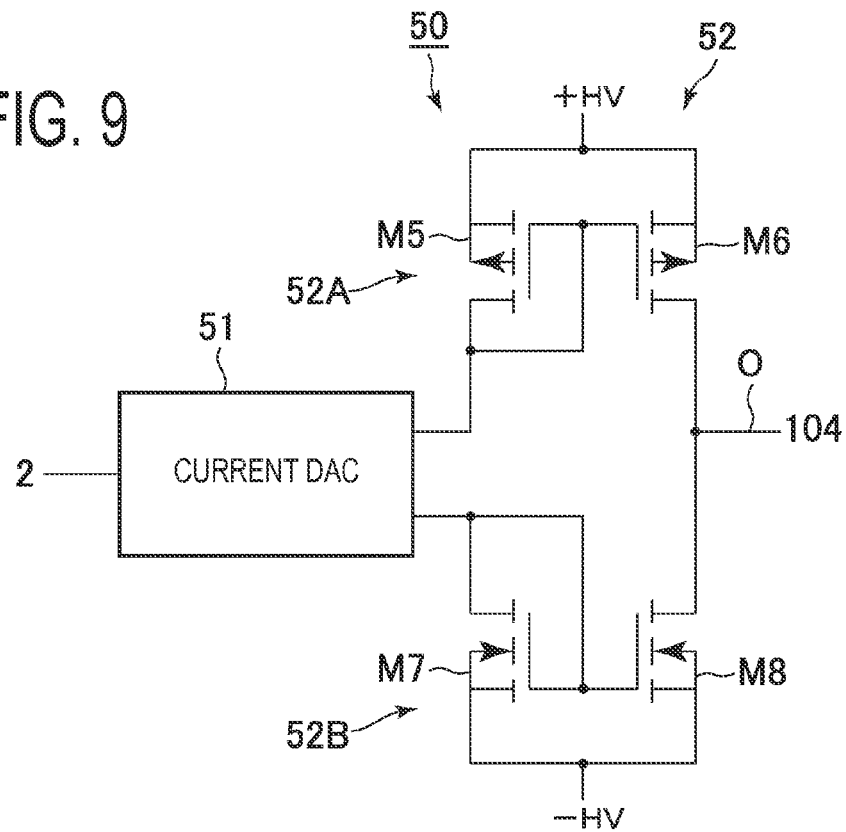

1

TRANSMISSION CIRCUIT, ULTRASONIC PROBE AND ULTRASONIC IMAGE DISPLAY APPARATUS

BACKGROUND OF THE INVENTION

The present invention relates to a transmission circuit which drives an ultrasonic transducer, an ultrasonic probe equipped with the transmission circuit, and an ultrasonic image display apparatus.

An ultrasonic image display apparatus transmits ultrasound to within a subject from an ultrasonic probe connected to an apparatus main body and receives its echoes through the ultrasonic probe thereby to generate an ultrasonic image within the subject. The ultrasonic probe is equipped with an ultrasonic transducer comprised of a piezoelectric material such as piezoelectric ceramic. The ultrasonic transducer is driven by a transmission circuit to perform the transmission of ultrasound (refer to, for example, Japanese Patent Application Laid-Open No. 2004-358133 and Japanese Patent Application Laid-Open No. 2008-68014). The transmission circuit is generally provided in the apparatus main body.

Now, a study of the provision of a transmission circuit in an ultrasonic probe is being conducted. When the transmission circuit is provided in the ultrasonic probe, it needs to be made smaller. Since the ultrasonic probe is held by an operator, the transmission circuit provided in the ultrasonic probe also needs to suppress the generation of heat due to power consumption rather than the case of the provision thereof in an apparatus main body.

It is however difficult for a conventional transmission circuit to be provided in an ultrasonic probe due to the size of the circuit and the generation of heat. For example, a transmission circuit described in JP 2004-358133, using complementary transistors and a ground clamp circuit, presents a problem in the generation of heat because power consumption is large upon generating coded pulses. There has also been known one using a Class-A amplifier as a transmission circuit. Since, however, the Class-A amplifier needs a feedback circuit, the size of the circuit becomes a problem. Further, since a high-speed feedback circuit becomes necessary, power consumption is large and the generation of heat also becomes a problem.

BRIEF DESCRIPTION OF THE INVENTION

The invention of one aspect made to solve the problems described above provides a transmission circuit comprising a high voltage current DAC which outputs a drive current of an ultrasonic transducer for performing transmission/reception of ultrasound; and a waveform generator which outputs a control signal for outputting a drive current having a desired magnitude from the high voltage current DAC to the high voltage current DAC with a predetermined timing, wherein the transmission circuit is provided in an ultrasonic probe having the ultrasonic transducer.

The invention of another aspect provides a transmission circuit comprising a current mirror circuit which outputs a drive current of an ultrasonic transducer for performing transmission/reception of ultrasound; a current DAC which outputs a current corresponding to the drive current having a desired magnitude to the current mirror circuit; and a waveform generator which outputs a control signal for outputting a current corresponding to the drive current having the desired magnitude from the current DAC to the current DAC with a predetermined timing, wherein the transmission circuit is provided in an ultrasonic probe having the ultrasonic transducer.

The invention of a further aspect provides an ultrasonic probe comprising a transmission circuit according to the invention of one or another aspect referred to above.

The invention of yet another aspect provides an ultrasonic image display apparatus comprising an ultrasonic probe according to the invention of the further aspect.

According to the invention of the above aspect, the transmission circuit equipped with the high voltage current DAC and the waveform generator can be provided in the ultrasonic probe because it is capable of achieving more circuit downsizing than the conventional transmission circuit and reducing power consumption to suppress the generation of heat.

According to the invention of another aspect referred to the above, the transmission circuit equipped with the current mirror circuit, the current DAC and the waveform generator can be provided in the ultrasonic probe because it is capable of achieving more circuit downsizing than the conventional transmission circuit and reducing power consumption to suppress the generation of heat.

BRIEF DESCRIPTION OF THE DRAWINGS

FIG. 6 is a diagram showing the relationship between a control signal outputted from the waveform generator and a drive current outputted from the high voltage current DAC;

FIG. 8 is a block diagram depicting the configuration of a transmission circuit employed in an ultrasonic image display apparatus according to a second embodiment of the present invention;

FIG. 9 is a diagram including a circuit diagram of a current mirror circuit in the transmission circuit shown in FIG. 8;

DETAILED DESCRIPTION OF THE INVENTION

Preferred embodiments of the present invention will hereinafter be explained in detail based on the accompanying drawings.

First Embodiment

Figure 1:
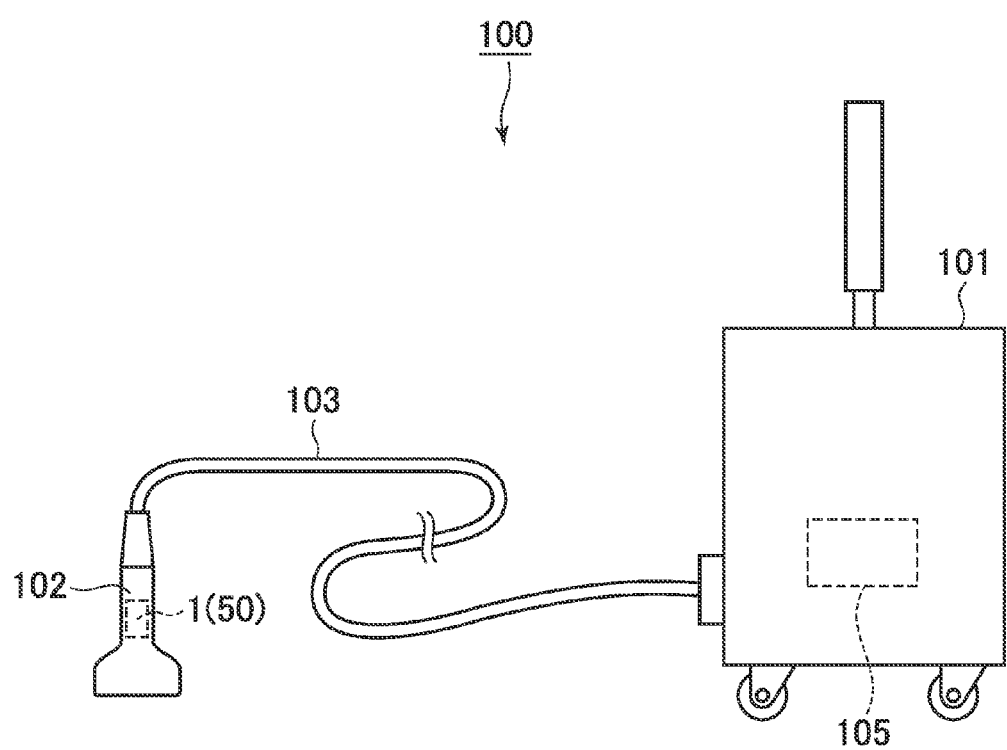
FIG. 1 is a schematic diagram showing one example of the embodiments of an ultrasonic image display apparatus of the present invention.

A first embodiment will first be described based on FIGS. 1 through 6. As shown in FIG. 1, an ultrasonic image display apparatus 100 has an apparatus main body 101 and an ultrasonic probe 102 connected to the apparatus main body 101. The ultrasonic probe 102 is connected to the apparatus main body 101 via a cable 103.

Figure 2:
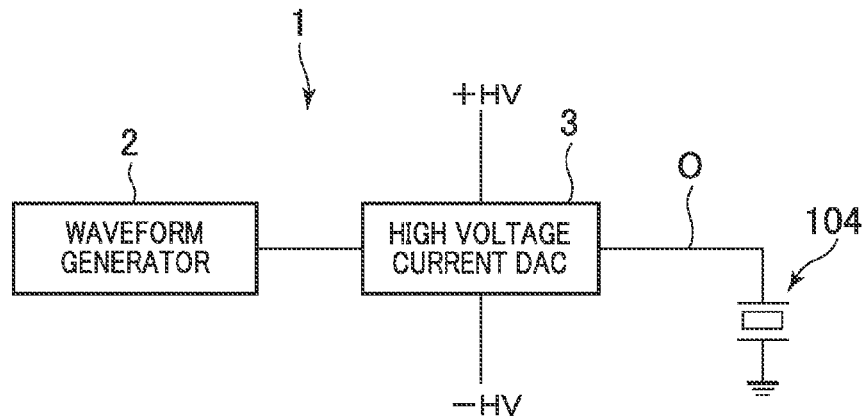
FIG. 2 is a block diagram illustrating the configuration of a transmission circuit in the ultrasonic image display apparatus according to the first embodiment of the present invention.
Figure 4:
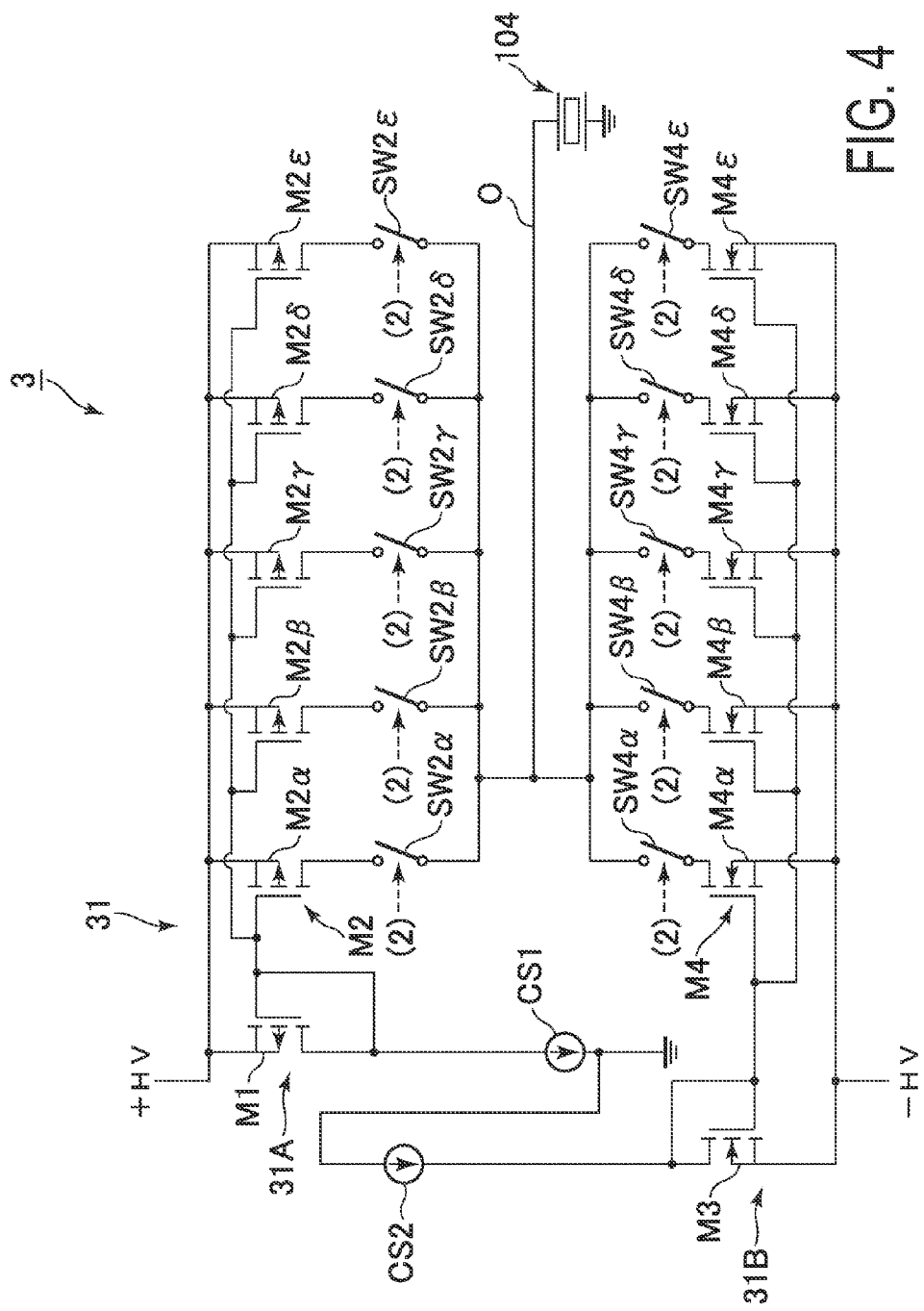
FIG. 4 is a circuit diagram showing a high voltage current DAC employed in the transmission circuit shown in FIG. 2.

The ultrasonic probe 102 is provided with a plurality of ultrasonic transducers 104 (refer to FIGS. 2 and 4) that perform transmission/reception of ultrasound (only one ultrasonic transducer 104 is however illustrated in FIGS. 2 and 4). The ultrasonic probe 102 is also provided with a transmission circuit 1 which drives the ultrasonic transducer 104.

Although not illustrated in particular, the ultrasonic probe 102 may be provided with a reception circuit that inputs ultrasound echo signals received by the ultrasonic transducer 104 therein and performs delay addition processing thereon.

The transmission circuit 1 will be explained. The transmission circuit 1 outputs a drive current of the ultrasonic transducer 104, based on a signal inputted from a controller 105 of the apparatus main body 101 via the cable 103. The signal inputted from the controller 105 contains information on ultrasonic transmission parameters.

As shown in FIG. 2, the transmission circuit 1 is equipped with a waveform generator 2 and a high voltage current Digital to Analog Converter (DAC) 3.

The high voltage current DAC 3 is connected to an output line O coupled to the ultrasonic transducer 104 and outputs a drive current I of the ultrasonic transducer 104 to the output line O. The number of the high voltage current DACs 3 is the same number (plural) as the maximum number of ultrasonic transducers 104 simultaneously used in transmission. Only one high voltage current DAC 3 relative to one ultrasonic transducer 104 is, however, shown herein. The high voltage current DAC 3 is one example of an embodiment of a high voltage current DAC.

The waveform generator 2 outputs a control signal for outputting a desired drive current I to the high voltage current DAC 3 with a predetermined timing. The waveform generator 2 is one example of an embodiment of a waveform generator. The number of the waveform generators 2 may be the same as the number of the high voltage current DACs 3. Only one waveform generator 2 relative to one high voltage current DAC 3 is, however, shown herein.

Incidentally, a RAM 22 (refer to FIG. 3 to be described later) of the waveform generator 2 may be provided in common to a plurality of high voltage current DACs 3. In this case, however, the number of read controllers 21 (refer to FIG. 3 to be described later) of the waveform generators 2 is the same as the number of the high voltage current DACs 3.

Figure 3:
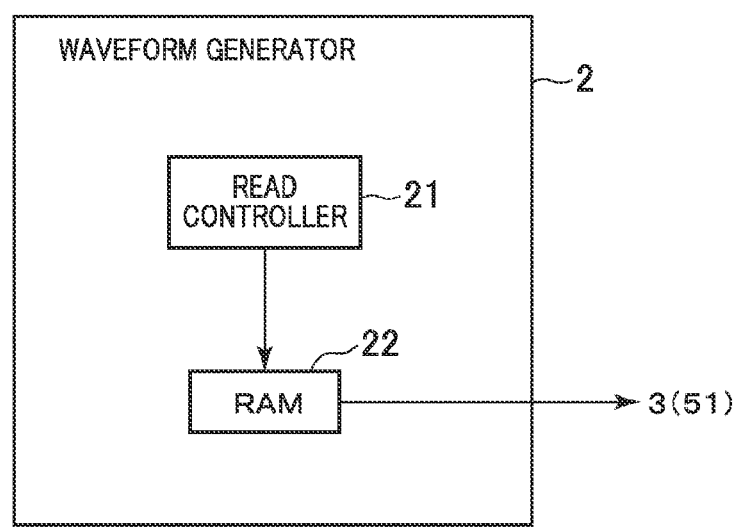
FIG. 3 is a block diagram depicting the configuration of a waveform generator employed in the transmission circuit shown in FIG. 2.

As shown in FIG. 3, the waveform generator 2 has a read controller 21 and a Random Access Memory (RAM) 22. Data about the magnitude of the drive current I is stored in the RAM 22. The magnitude of the drive current I is outputted from the controller 105. The RAM 22 is one example of a memory.

The read controller 21 reads data stored in the RAM 22 with a timing corresponding to a transmission delay. Thus, a digital control signal corresponding to a drive current I having a desired magnitude is outputted from the RAM 22 and inputted to the high voltage current DAC 3.

The high voltage current DAC 3 converts the digital control signal outputted from the waveform generator 2 into analog form and outputs it to the output line O as the drive current I. The high voltage current DAC 3 has a high voltage current mirror circuit 31 as shown in FIG. 4. In the present example, the current mirror circuit 31 includes a positive-side high voltage current mirror circuit 31A and a negative-side high voltage current mirror circuit 31B.

The positive-side high voltage current mirror circuit 31A is connected to a positive voltage +HV and outputs a positive drive current I to the output line O. Whereas, the negative-side high voltage current mirror circuit 31B is connected to a negative voltage −HV and outputs a negative drive current I to the output line O. Incidentally, in order to enhance energy efficiency, the magnitudes of the positive and negative voltages ±HV may be optimized according to the output of the RAM 22 and the impedance of the ultrasonic probe 102.

The positive-side high voltage current mirror circuit 31A comprises a pair of transistors M1 and M2, whereas the negative-side high voltage current mirror circuit 31B comprises a pair of transistors M3 and M4. The transistors M1 and M3 are one example illustrative of an embodiment of a first transistor. The transistors M2 and M4 are one example illustrative of an embodiment of a second transistor.

The transistors M1 and M2 are p-channel type MOS-FETs, and the transistors M3 and M4 are n-channel type MOS-FETs. These transistors M1 through M4 are of MOS-FETs that are high in breakdown voltage (e.g., 10 to 100V). Incidentally, the term "high voltage" means that the respective transistors M1 through M4 are high in breakdown voltage.

Incidentally, in the positive-side high voltage current mirror circuit 31A, a ratio ra between current flowing through the transistor M1 side and current flowing through the transistor M2 (corresponding to transistors M2α through M2ε to be described later) side is set to a predetermined ratio. Whereas, in the negative-side high voltage current mirror circuit 31B, a ratio rb between current flowing through the transistor M3 side and current flowing through the transistor M4 (corresponding to transistors M4α through M4ε to be described later) side is set to a predetermined ratio. The ratio ra and the ratio rb are the same.

Of the transistors M1 and M2, the plural transistors M2 are provided in parallel. In the present example, the transistors M2α, M2β, M2γ, M2δ and M2ε are provided as the transistors M2. Of the transistors M3 and M4, the plural transistors M4 are provided in parallel. In the present example, the transistors M4α, M4β, M4γ, M4δ and M4ε are provided as the transistors M4.

In the transistor M1 and the transistors M2α through M2ε, the source sides thereof are connected to the positive voltage +HV. The gate of the transistor M1 and the gates of the transistors M2α through M2ε are connected to one another.

On the other hand, in the transistor M3 and the transistors M4α through M4ε, the source sides thereof are connected to the negative voltage −HV. The gate of the transistor M3 and the gates of the respective transistors M4α through M4ε are connected to one another.

The drain side of the transistor M1 is connected to a first current source CS1, and the drain side of the transistor M3 is connected to a second current source CS2. On the other hand, the drain sides of the transistors M2α through M2ε and the transistors M4α through M4ε are respectively connected to the output line O.

Switches SW2α, SW2β, SW2γ, SW2δ and SW2ε are respectively provided between the drain sides of the transistors M2α through M2ε and the output line O. Switches SW4α, SW4β, SW4γ, SW4δ and SW4ε are respectively provided between the drain sides of the transistors M4α through M4ε and the output line O. The switches SW2α through SW2ε and the switches SW4α through SW4ε are respectively inputted with control signals of respective bits outputted from the waveform generator 2, by which their on and off are controlled.

When the respective switches SW2α through SW2ε are off, the drain currents of the transistors M2α through M2ε do not flow. On the other hand, when the respective switches SW2α through SW2ε are on, the drain currents of the transistors M2α through M2ε flow. Turning on any or all of the switches SW2α through SW2ε allows a drive current I to flow through the output line O. Further, when the respective switches SW4α through SW4ε are off, the drain currents of the transistors M4α through M4ε do not flow. When the respective switches SW4α through SW4ε are on, the drain currents of the transistors M4α through M4ε flow. Turning on any or all of the switches SW4α through SW4ε allow a drive current I to flow through the output line O.

Figure 5:
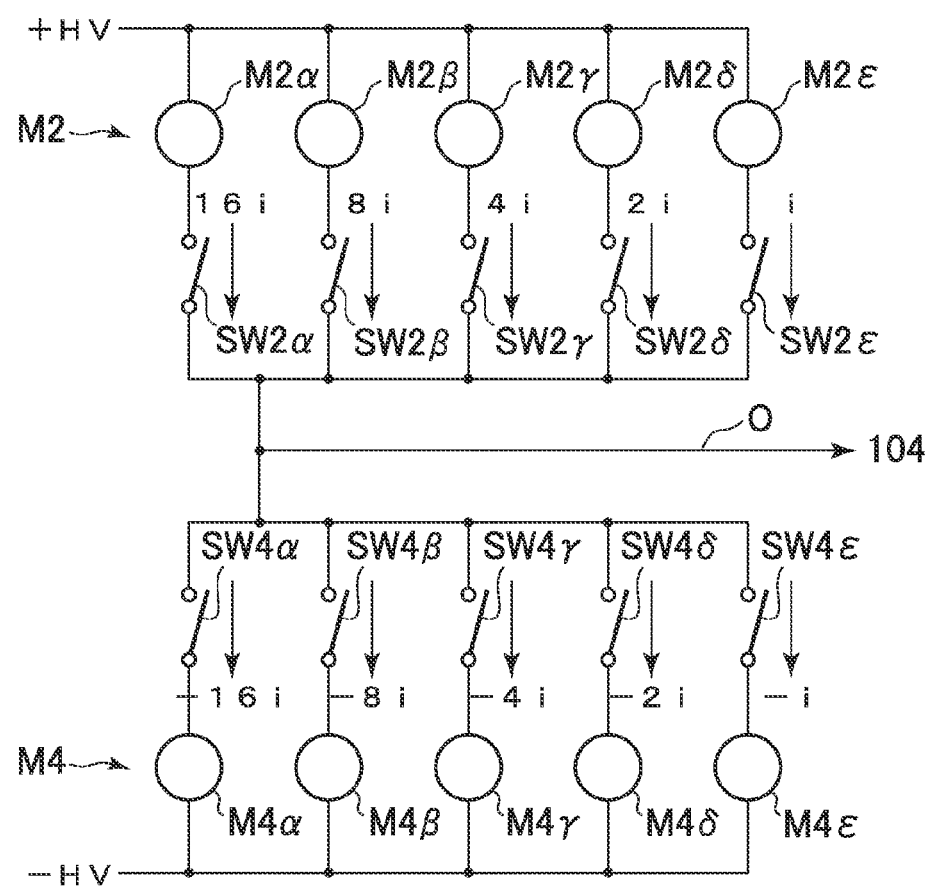
FIG. 5 is a diagram for explaining one example of drain currents of respective transistors that configure the high voltage current DAC.

The magnitude of the drive current I flowing through the output line O is determined according to whether any of the switches SW2α through SW2 and SW4α through SW4ε is turned on. Described specifically, the drain currents of the transistors M2α through M2ε are different in magnitude. Each of the transistors M2α through M2ε takes up such an area that a desired drive current flows. Assuming that the magnitude of the drain current of the transistor M2ε (simplified in FIG. 5 and indicated in a circle, and other transistors are similar to it) is i as shown in FIG. 5, for example, the magnitude of the drain current of the transistor M2δ becomes 2i, the magnitude of the drain current of the transistor M2γ becomes 4i, the magnitude of the drain current of the transistor M2β becomes 8i, and the magnitude of the drain current of the transistor M2α becomes 16i, respectively.

Likewise, the drain currents of the transistors M4α through M4ε are also different in magnitude. Each of the areas of the transistors M4α through M4ε also takes up such an area that a desired drain current flows. Assuming that the magnitude of the drain current of the transistor M4ε is −i as shown in FIG. 5, for example, the magnitude of the drain current of the transistor M4δ becomes −2i, the magnitude of the drain current of the transistor M4γ becomes −4i, the magnitude of the drain current of the transistor M4β becomes −8i, and the magnitude of the drain current of the transistor M4α becomes −16i, respectively.

One example of the relationship between the control signals and drive currents I (drain currents) outputted from the waveform generator 2 will be explained based on FIG. 6. FIG. 6 shows the relationship between control signals of 5 bits inputted to the switches SW2α through SW2 and their corresponding drive currents I.

Assume that in FIG. 6, the switch SW2 inputted with "0" is turned off and the switch SW2 inputted with "1" is turned on. When, for example, "0" is inputted to the switch SW2α, "0" is inputted to the switch SW2β, "0" is inputted to the switch SW2γ, "0" is inputted to the switch SW2δ, and "1" is inputted to the switch SW2ε, the drive current I becomes i. When "0" is inputted to the switch SW2α, "0" is inputted to the switch SW2β, "0" is inputted to the switch SW2γ, "1" is inputted to the switch SW2δ, and "0" is inputted to the switch SW2ε, the drive current I becomes 2i. When "0" is inputted to the switch SW2α, "0" is inputted to the switch SW2β, "0" is inputted to the switch SW2γ, "1" is inputted to the switch SW2δ, and "1" is inputted to the switch SW2ε, the drive current I becomes 3i. Thus, the turning on and off of the switches SW2α through SW2ε are controlled so that the currents from 0 to 31i are obtained as the drive currents I.

Likewise, 5-bit control signals are inputted even to the switches SW4α through SW4ε so that their on and off are controlled. Thus, the currents from 0 to −31i are obtained as the drive currents I. As described above, the currents of −31i to 31i are obtained as desired drive currents I.

Incidentally, in FIG. 4, the high voltage current DAC 3 is simplified. The high voltage current mirror circuit 31, for example, may be cascade current mirror circuit. The switches SW2α through SW2ε and the switches SW4α through SW4ε are MOS-FETs. Furthermore, it is needless to say that the added circuit(not illustrated) for protecting devices against voltage destruction is needed in the high voltage current DAC 3.

According to the present embodiment as described above, the transmission circuit 1 comprising the high voltage current DAC 3 having the high voltage current mirror circuit 31, and the waveform generator 2 is capable of achieving more downsizing than the conventional transmission circuit and reducing power consumption to suppress the generation of heat. The transmission circuit 1 can therefore be provided in the ultrasonic probe 102.

Figure 7:
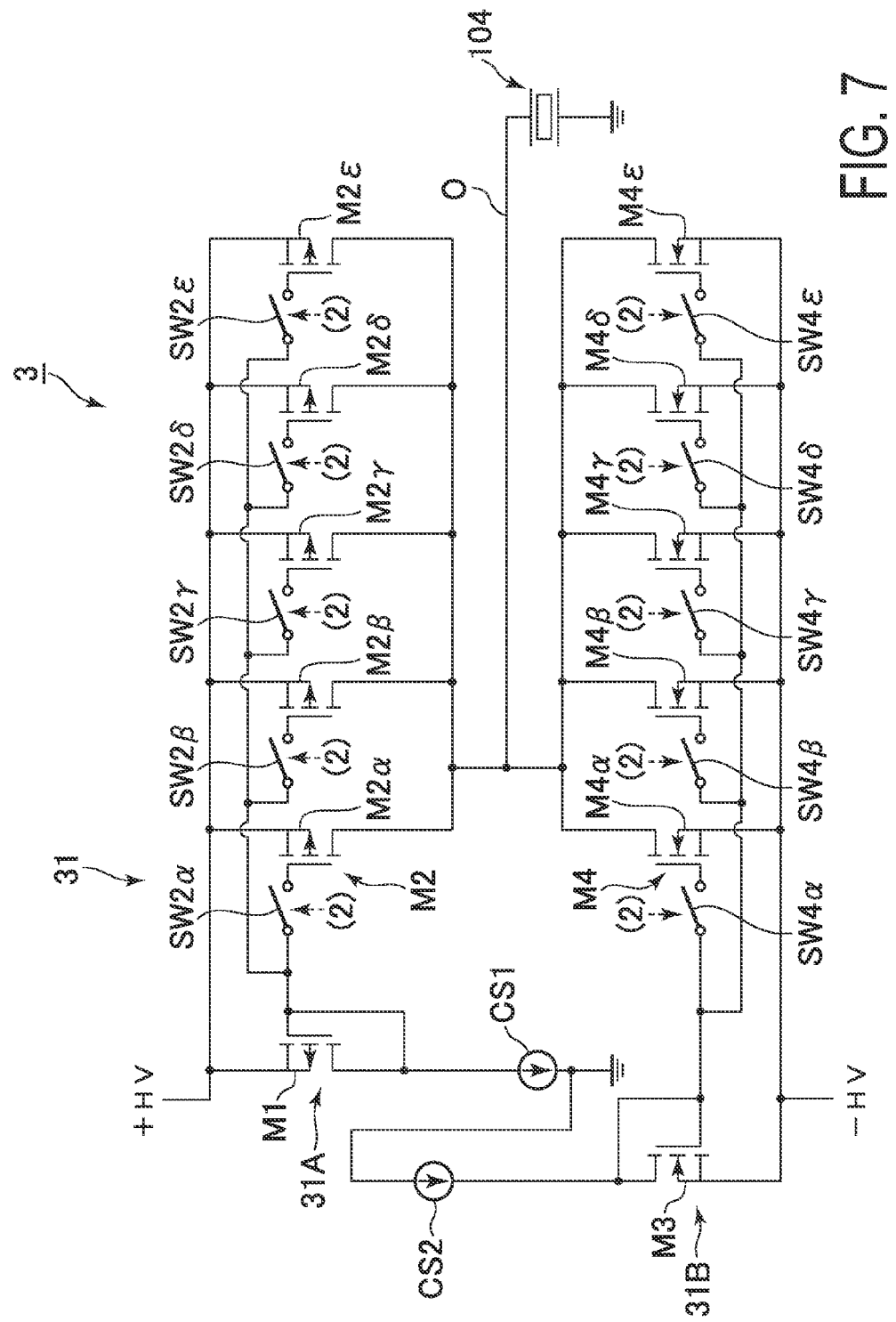
FIG. 7 is a circuit diagram illustrating a high voltage current DAC employed in a transmission circuit according to a modification of the first embodiment.

Then, a modification of the first embodiment will be explained based on FIG. 7. As shown in FIG. 7, the switches SW2α through SW2ε are respectively provided between the gates of the transistor Ml and the transistors M2α through M2ε. Any or all of the switches SW2α through SW2ε are turned on in a manner similar to the above, so that the drive currents I flow through the output line O. The magnitude of the drive current I is determined according to whether any of the switches SW2α through SW2ε is turned on.

Further, the switches SW4α through SW4ε are provided between the gate of the transistor M3 and the gates of the transistors M4α through M4ε. Any or all of the switches SW4α through SW4ε are turned on in a manner similar to the above, so that the drive currents I flow through the output line O. The magnitude of the drive current I is determined according to whether any of the switches SW4α through SW4ε is turned on.

Second Embodiment

A second embodiment will next be explained based on FIGS. 8 and 9. The same components as those in the first embodiment are however assigned the same reference numerals, and explanations thereof are omitted.

A transmission circuit 50 according to the present embodiment is equipped with the waveform generator 2, current DAC 51 and current mirror circuit 52 as shown in FIG. 8. Incidentally, the transmission circuit 50 of the present embodiment is also provided in the ultrasonic probe 102 (refer to FIG. 1). The numbers of the current DACs 51 and the current mirror circuits 52 are respectively the same number (plural) as the maximum number of ultrasonic transducers 104 simultaneously used in transmission. Only one high voltage current DAC 3 relative to one ultrasonic transducer 104 is however shown herein.

Here, the current mirror circuit 52 includes a positive-side high voltage current mirror circuit 52A and a negative-side high voltage current mirror circuit 52B to be described later. The number of these positive-side and negative-side high voltage current mirror circuits 52A and 52B becomes the same number as the maximum number of ultrasonic transducers 104 simultaneously used in transmission.

The current mirror circuit 52 is connected to the output line O and outputs a drive current I to the output line O. The current DAC 51 outputs a current id corresponding to a desired drive current I to the current mirror circuit 52. Further, the waveform generator 2 outputs a control signal for outputting the current id to the current DAC 51 in the present embodiment. The current DAC 51 is one example of an embodiment of a current DAC. The current mirror circuit 52 is one example of an embodiment of a current mirror circuit.

The RAM 22 (refer to FIG. 2) of the waveform generator 2 outputs a control signal for outputting a current id corresponding to a drive current I having a desired magnitude. The current DAC 51 converts a digital control signal outputted from the waveform generator 2 into analog form and outputs it as the current id. Although not illustrated in particular, the current DAC 51 comprises a current mirror circuit having a pair of transistors and outputs a current id having a magnitude corresponding to a control signal inputted thereto. The current DAC 51 is of a low voltage current DAC. Here, the term "low voltage" means that the transistors (not shown) in the current mirror circuit that configures the current DAC 51 are low in breakdown voltage (e.g., 3 to 5V).

In the present example, the current mirror circuit 52 includes a positive-side high voltage current mirror circuit 52A and a negative-side high voltage current mirror circuit 52B. The positive-side high voltage current mirror circuit 52A is connected to a positive voltage +HV and outputs a positive drive current Ito the output line O. Whereas, the negative-side high voltage current mirror circuit 52B is connected to a negative voltage –HV and outputs a negative drive current I to the output line O. The positive-side high voltage current mirror circuit 52A is one example of an embodiment of a positive-side current mirror circuit. The negative-side high voltage current mirror circuit 52B is one example of an embodiment of a negative-side current mirror circuit.

As shown in FIG. 9, the positive-side high voltage current mirror circuit 52A comprises a pair of transistors MS and M6, and the negative-side high voltage current mirror circuit 52B comprises a pair of transistors M7 and M8. The transistors MS and M6 are p-channel type MOS-FETs, and the transistors M7 and M8 are n-channel type MOS-FETs. These transistors MS through M8 are of MOS-FETs that are high in breakdown voltage (e.g., 10 to 100V). Incidentally, the term "high voltage" means that the transistors MS through M8 are high in breakdown voltage.

In the transistors MS and M6, the source sides thereof are connected to the positive voltage +HV and their gates are connected to each other. The drain side of the transistor MS is connected to the current DAC 51, and the drain side of the transistor M6 is connected to the output line O.

In the transistors M7 and M8, the source sides thereof are connected to the negative voltage –HV and their gates are connected to each other. The drain side of the transistor M7 is connected to the current DAC 51, and the drain side of the transistor M8 is connected to the output line O.

Each of the positive-side high voltage current mirror circuit 52A and the negative-side high voltage current mirror circuit 52B outputs a drive current I corresponding to the magnitude of a current id inputted from the current DAC 51 to the output line O. Even in the present example, a current having a desired magnitude is outputted as the drive current I.

According to the present embodiment, the transmission circuit 50 equipped with the current mirror circuit 52, the current DAC 51 and the waveform generator 2 is also capable of achieving more circuit downsizing than the conventional transmission circuit and reducing power consumption to suppress the generation of heat in a manner similar to the first embodiment. The transmission circuit 50 can therefore be provided in the ultrasonic probe 102.

Figure 10:
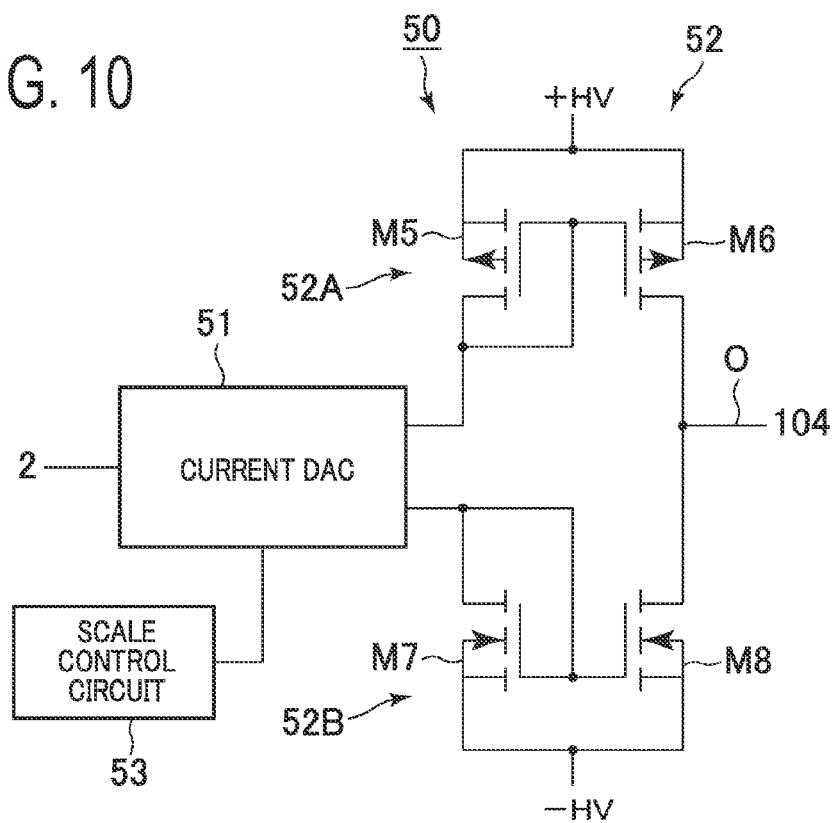
FIG. 10 is a diagram including a circuit diagram of a current mirror circuit employed in a modification of the second embodiment.

Then, a modification of the second embodiment will be explained. In the present modification, as shown in FIG. 10, a scale control circuit 53 for adjusting or controlling the scale of a current id outputted from the current DAC 51 is connected to the current DAC 51. In the present modification, in order to enhance energy efficiency, the magnitudes of the positive and negative voltages ±HV may be optimized according to the control of the scale by the scale control circuit 53.

Figure 11:
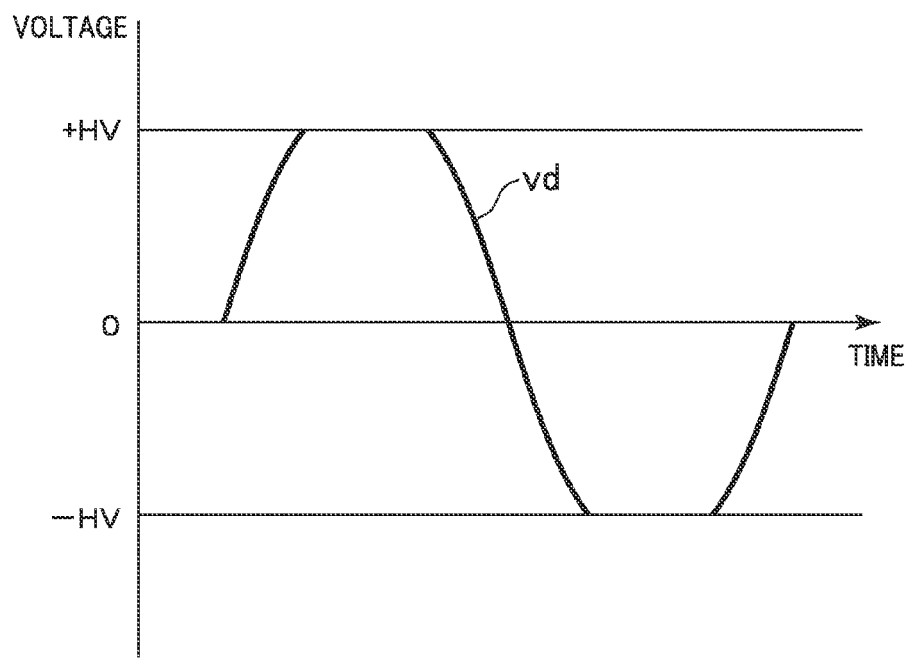
FIG. 11 is a diagram showing an output voltage of a current DAC employed in a transmission circuit shown in FIG. 10 and positive and negative voltages ±HV thereof.

The magnitude of the scale may be set by the scale control circuit 53 in such a manner as to have a portion at which the absolute value of the output voltage vd shown in FIG. 11, of the current DAC 51 becomes larger than each of the positive and negative voltages ±HV at the waveform of the output voltage vd. Since harmonic components are contained in the waveform of such an output voltage vd, the transmission of ultrasound in a harmonic mode is enabled.

The scale control circuit 53 may be configured to be capable of independently controlling the scale of an output current id of the current DAC 51 to the positive-side current mirror circuit 52A and the scale of an output current id of the current DAC 51 to the negative-side current mirror circuit 52B.

Here, an error may occur between a ratio ra between the current on the transistor M5 side and the current on the transistor M6 side in the positive-side current mirror circuit 52A and a ratio rb between the current on the transistor M7 side and the current on the transistor M8 side in the negative-side current mirror circuit 52B. As described above, however, the scale control circuit 53 can independently control the scale of the output current id to the positive-side current mirror circuit 52A and the scale of the output current id to the negative-side current mirror circuit 52B, thereby making it possible to correct the error between the ratio ra and the ratio rb.

Third Embodiment

Then, a third embodiment will be described based on FIG. 12. The same components as those in the respective embodiments are however assigned the same reference numerals, and explanations thereof are omitted.

Figure 12:
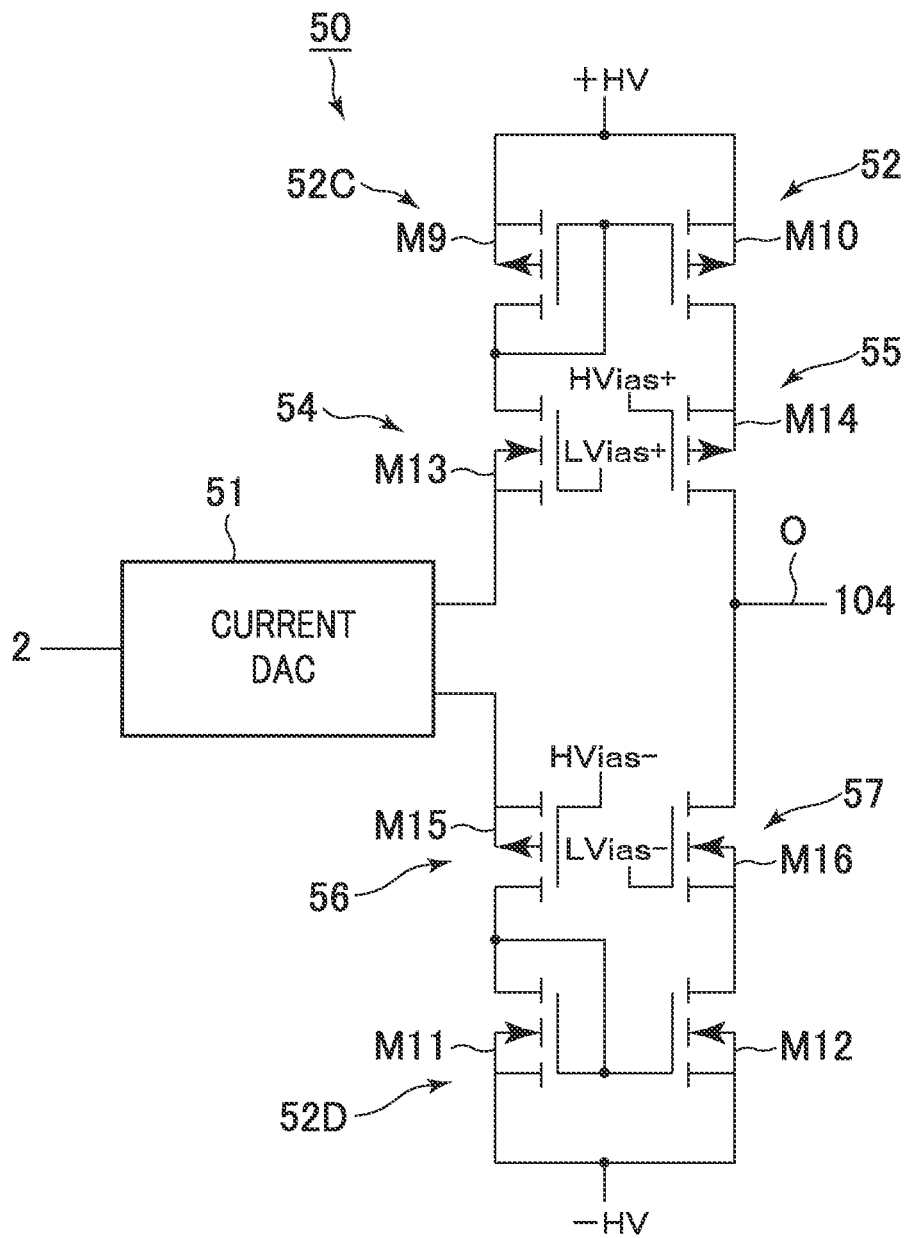
FIG. 12 is a diagram showing a transmission circuit employed in an ultrasonic image display apparatus according to a third embodiment of the present invention, and a diagram including a circuit diagram of a current mirror circuit and an emitter follower circuit.

In a transmission circuit 50 according to the present embodiment, the current mirror circuit 52 has a positive-side low voltage current mirror circuit 52C and a negative-side low voltage current mirror circuit 52D as shown in FIG. 12. The transmission circuit 50 has a first voltage protection circuit 54, a second voltage protection (common-gate) circuit 55, a third voltage protection circuit 56 and a fourth voltage protection circuit 57. The positive-side low voltage current mirror circuit 52C is one example of an embodiment of a positive-side current mirror circuit. The negative-side low voltage current mirror circuit 52D is one example of an embodiment of a negative-side current mirror circuit. Each of the voltage protection circuits 54 through 57 is one example of an embodiment of a voltage protection circuit.

The positive-side low voltage current mirror circuit 52C comprises a pair of transistors M9 and M10, and the negative-side low voltage current mirror circuit 52D comprises a pair of transistors M11 and M12. The transistors M9 and M10 are p-channel type MOS-FETs, and the transistors M11 and M12 are n-channel type MOS-FETs. These transistors M9 through M12 are of MOS-FETs that are low in breakdown voltage (e.g., 3 to 5V). Incidentally, the term "low voltage" means that the transistors M9 through M12 are low in breakdown voltage.

The first voltage protection circuit 54 comprised of a transistor M13 is connected to the drain side of the transistor M9. The transistor M13 is of an n-channel type MOS-FET, of which the drain side is connected to the drain side of the transistor M9 and the source side is connected to the current DAC 51. The gate of the transistor M13 is connected to a positive bias voltage (LVias +).

The second voltage protection circuit 55 comprised of a transistor M14 is connected to the drain side of the transistor M10. The transistor M14 is of a p-channel type MOS-FET, of which the source side is connected to the drain side of the transistor M10 and the drain side is connected to the output line O. The gate of the transistor M14 is connected to a positive bias voltage (HVias +). Incidentally, HVias +>LVias +.

The third voltage protection circuit 56 comprised of a transistor M15 is connected to the drain side of the transistor M11. The transistor M15 is of a p-channel type MOS-FET, of which the drain side is connected to the drain side of the transistor M11 and the source side is connected to the current DAC 51. The gate of the transistor M15 is connected to a negative bias voltage (HVias –).

The fourth voltage protection circuit 57 comprised of a transistor M16 is connected to the drain side of the transistor M12. The transistor M16 is of an n-channel type MOS-FET, of which the source side is connected to the drain side of the transistor M12 and the drain side is connected to the output line O. The gate of the transistor M16 is connected to a negative bias voltage (LVias –). Incidentally, LVias –>HVias +.

The transistors M13 through M16 are MOS-FETs high in breakdown voltage (e.g., 10 to 100V). The first through fourth voltage protection circuits 54 through 57 respectively comprising the transistors M13 through M16 protect the transistors M9 through M12 from breakdown due to the voltage. Each of the first through fourth voltage protection circuits 54 through 57 is one example of an embodiment of a protection circuit in the present invention.

Incidentally, bipolar transistors may be used as transistors in place of MOS-FETs.

Figure 13:
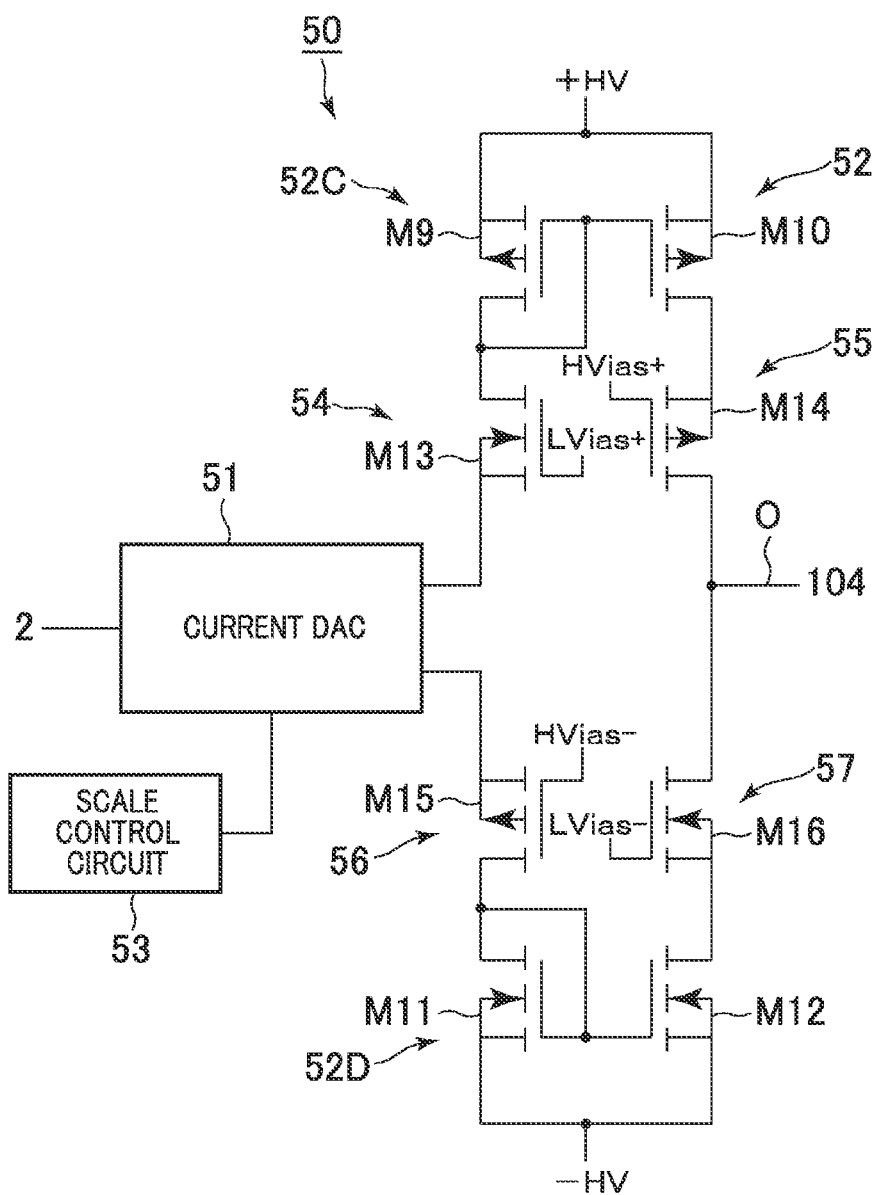
FIG. 13 is a diagram illustrating another example of the transmission circuit employed in the ultrasonic image display apparatus according to the third embodiment and a diagram of the transmission circuit having a scale control circuit.

Even in the transmission circuit 50 of the present embodiment, as shown in FIG. 13, the scale control circuit 53 may be connected to the current DAC 51.

Although the present invention has been described above by the embodiments, it is needless to say that the present embodiments may be modified in various ways in a range not departing from the gist of the present invention.

What is claimed is:

1. A transmission circuit for use with an ultrasonic probe including an ultrasonic transducer, said transmission circuit comprising:
a high voltage current digital to analog converter (DAC) configured to output a drive current to the ultrasonic transducer to transmit and receive ultrasound, wherein the high voltage current DAC comprises a high voltage current mirror circuit including:
a first transistor and a plurality of second transistors corresponding to the first transistor, wherein at least one current flows from at least one of the second transistors to an output line;
a positive-side high voltage current mirror circuit connected to a positive voltage and configured to output a positive drive current; and
a negative-side high voltage current mirror circuit connected to a negative voltage; and
a waveform generator configured to output a control signal to the high voltage current DAC with a predetermined timing to output the drive current with a desired magnitude from the high voltage current DAC.

2. The transmission circuit according to claim 1, wherein the high voltage current DAC is configured to convert each of digital control signals outputted from the waveform generator into analog signals and to output the analog signals as the drive current.

3. The transmission circuit according to claim 1, further comprising switches between the second transistors and the output line respectively, wherein the switches are turned on and off by the control signal to control the at least one current flowing from the second transistors to the output line.

4. The transmission circuit according to claim 1, wherein the first and second transistors comprise field effect transistors connected to each other, said transmission circuit further comprising switches coupled between gates of the first and second field effect transistors, wherein the switches are turned on and off by the control signal to control the at least one current flowing from the second transistors to the output line.

5. The transmission circuit according to claim 1 comprising a plurality of high voltage current DACs and a plurality of the waveform generators.

6. A transmission circuit for use with an ultrasonic probe including an ultrasonic transducer, said transmission circuit comprising:
a current mirror circuit configured to output a drive current to the ultrasonic transducer to transmit and receive ultrasound, wherein the current mirror circuit comprises:
a positive-side current mirror circuit connected to a positive voltage and configured to output a positive drive current; and
a negative-side current mirror circuit connected to a negative voltage and configured to output a negative drive current;
a current digital to analog converter (DAC) configured to output a current corresponding to the drive current with a desired magnitude to the current mirror circuit; and
a waveform generator configured to output a control signal to the current DAC with a predetermined timing, wherein the control signal includes a current corresponding to the drive current having the desired magnitude.

7. The transmission circuit according to claim 6, wherein the currently mirror circuit further comprises a pair of transistors, a first transistor of the pair of transistors is connected to an output line connected to the ultrasonic transducer, and a second transistor of the pair of transistors is connected to the current DAC.

8. The transmission circuit according to claim 6, wherein the current mirror circuit comprises a high voltage current mirror circuit.

9. The transmission circuit according to claim 6, wherein the current mirror circuit comprises a low voltage current mirror circuit, said transmission circuit further comprising a voltage protection circuit configured to protect a transistor of the low voltage current mirror circuit from breakdown caused by a voltage connected to the transistor.

10. The transmission circuit according to claim 6, wherein the current DAC comprises a low voltage current DAC.

11. The transmission circuit according to claim 6, further comprising a scale control circuit configured to control a scale of an output current of the current DAC.

12. The transmission circuit according to claim 6, wherein the scale control circuit is configured to independently control a scale of an output current of the current DAC to the positive-side current mirror circuit and a scale of an output current of the current DAC to the negative-side current mirror circuit.

13. The transmission circuit according to claim 6, further comprising a plurality of current mirror circuits, a plurality of current DACs, and a plurality of waveform generators.

14. The transmission circuit according to claim 6, wherein the waveform generator comprises:

a memory configured to store data corresponding to magnitudes of a plurality of drive currents; and a read controller configured to read the data in the memory as the control signal with a timing corresponding to an ultrasonic transmission delay.

15. An ultrasonic probe comprising:
an ultrasonic transducer; and
a transmission circuit comprising:
- a current mirror circuit configured to output a drive current to said ultrasonic transducer to transmit and receive ultrasound, wherein the current mirror circuit comprises:
  - a positive-side current mirror circuit connected to a positive voltage and configured to output a positive drive current; and
  - a negative-side current mirror circuit connected to a negative voltage and configured to output a negative drive current;
- a current digital to analog converter (DAC) configured to output a current corresponding to the drive current with a desired magnitude to the current mirror circuit; and
- a waveform generator configured to output a control signal to the current DAC with a predetermined timing, wherein the control signal includes a current corresponding to the drive current having the desired magnitude.

16. An ultrasonic image display apparatus comprising the ultrasonic probe according to claim 15.

* * * * *